United States Patent [19]

Gansert et al.

[11] 4,128,801
[45] Dec. 5, 1978

[54] VOLTAGE REGULATOR STRUCTURE FOR AUTOMOTIVE-TYPE GENERATORS

[75] Inventors: Willi Gansert, Kornwestheim; Norbert Rittmannsberger, Stuttgart, both of Germany

[73] Assignee: Robert Bosch GmbH, Stuttgart, Germany

[21] Appl. No.: 775,283

[22] Filed: Mar. 7, 1977

[30] Foreign Application Priority Data

Mar. 11, 1976 [DE] Fed. Rep. of Germany ....... 2610136

[51] Int. Cl.² .................... H02P 9/30; H01L 25/00
[52] U.S. Cl. .................... 322/28; 174/52 H; 357/75; 361/421
[58] Field of Search ............ 174/52 H, 50.5, 50.52, 174/50.53, 50.54; 357/75; 322/28; 361/421

[56] References Cited

U.S. PATENT DOCUMENTS

| | | | |
|---|---|---|---|
| 3,532,962 | 10/1970 | Balcke et al. | 322/28 |
| 3,539,907 | 11/1970 | Linstedt | 322/28 |
| 3,582,762 | 6/1971 | Mori et al. | 322/28 |
| 3,588,617 | 6/1971 | Grozinger et al. | 322/28 UX |
| 3,876,926 | 4/1975 | Schott et al. | 322/28 |
| 4,032,964 | 6/1977 | Boeters | 357/74 |

*Primary Examiner*—Robert J. Hickey
*Attorney, Agent, or Firm*—Flynn & Frishauf

[57] ABSTRACT

A free-wheeling diode, a control circuit portion and a power circuit portion which selectively include active semiconductor elements and passive electrical circuit elements, such as diodes and resistors, are all included in a housing having a metallic base, the housing having two lead-through pins sealed therethrough in insulated relation, so that the housing can be readily attached to the generator housing structure, particularly to the brush assembly thereof, and the lead-through pins selectively directly connected to a brush connected to the exciter field of the generator and another connected to the positive output terminal of the generator, thus facilitating overall construction and assembly of the voltage regulator as well as assembly of the voltage regulator with and to the generator.

19 Claims, 16 Drawing Figures

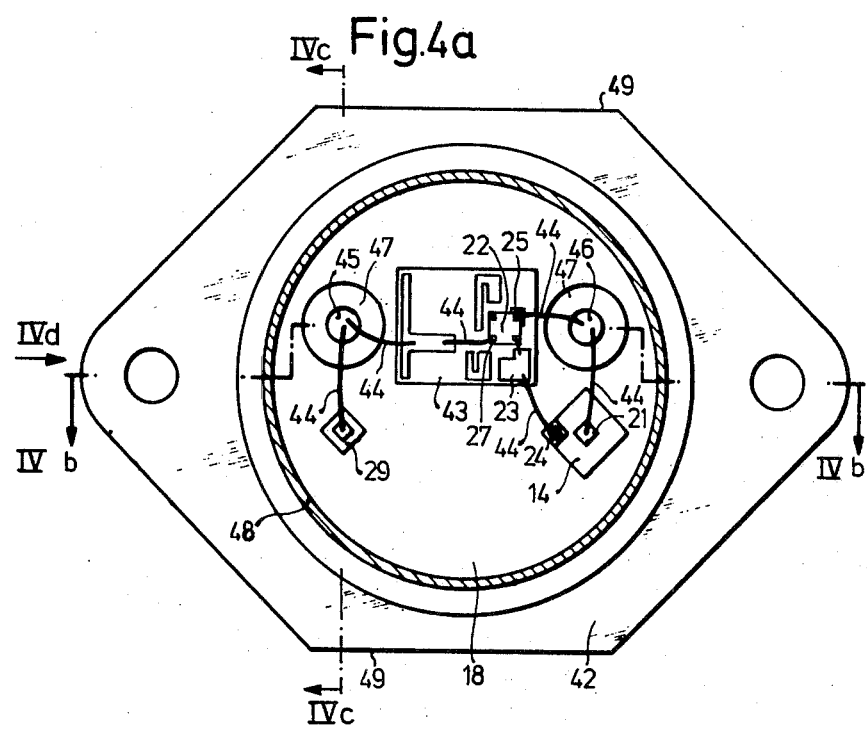
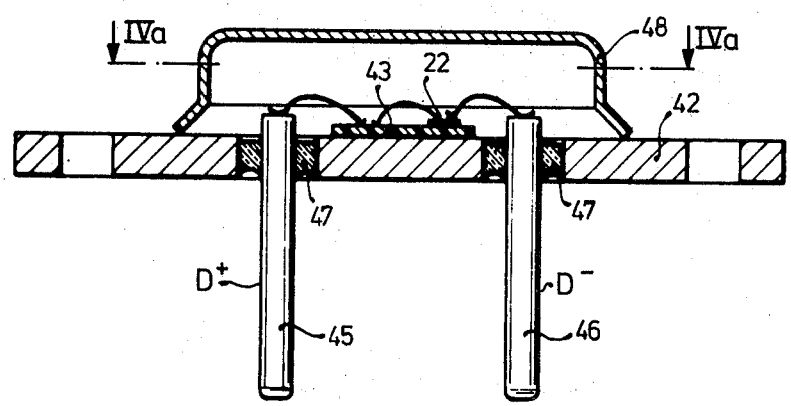

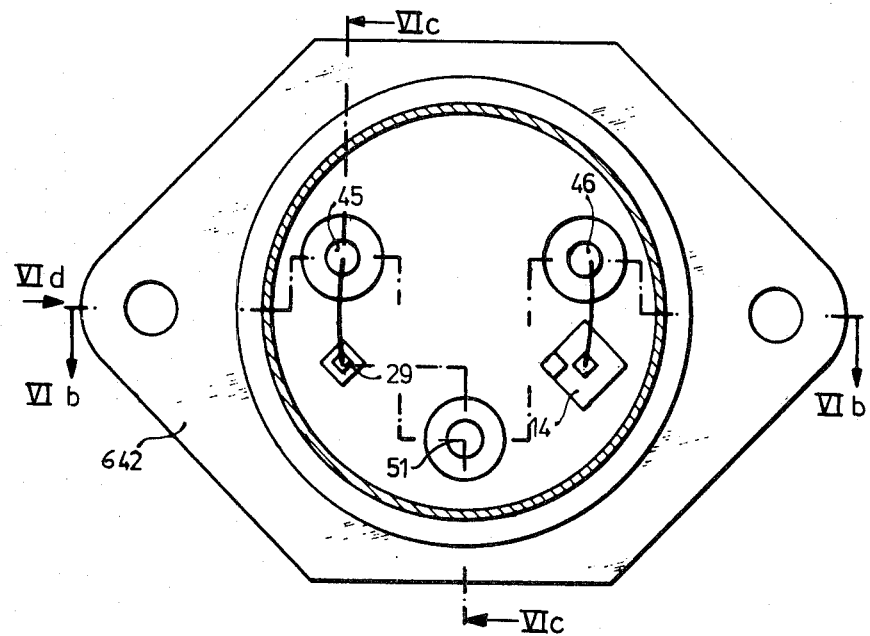
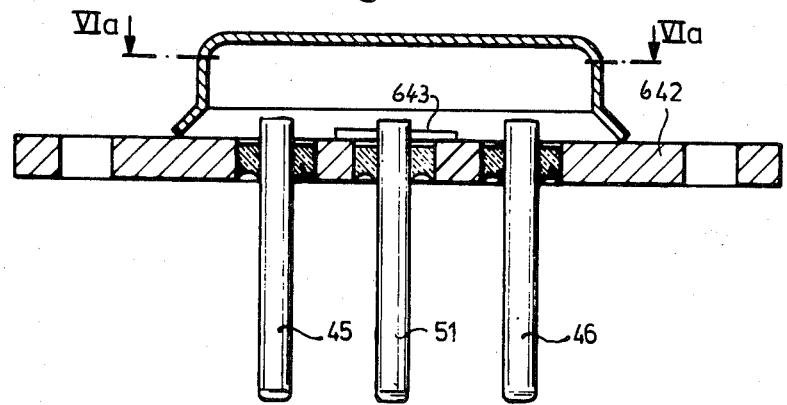

53 REGULATOR
BRUSH HOLDER

VOLTAGE REGULATOR STRUCTURE FOR AUTOMOTIVE-TYPE GENERATORS

Cross reference to related application, assigned to the assignee of the present invention: Ser. No. 775,284 Filed Mar. 7, 1977, Title: "SOLID STATE VOLTAGE REGULATED AUTOMOTIVE-TYPE ELECTRICAL POWER SUPPLY SYSTEM", Gansert et al.

The present invention relates to a voltage regulator structure for combination with an automotive-type generator, and more particularly for combination with an automotive-type alternator having an excited field, the armature terminals of which are connected to a rectifier structure.

Voltage regulators for automotive use are combined with alternators in order to maintain the output voltage of the alternator, as rectified, at a constant level. The usual function of the voltage regulator is to connect and disconnect the excitation current for the field of the alternator through varying duty cycles, that is, during more or less extensive time periods. The output voltage of the generator itself is used as the reference for the switching function of the voltage regulator.

Many types of voltage regulators have been proposed. Usually they are separately housed in a special housing, and connected by electrical cables to the alternator field and to the output terminals of the alternator. It has been proposed to locate the regulator separately and apart from the generator, for example by mounting it on the chassis of the motor vehicle, for example on the fire wall within the engine compartment. It has also been proposed to mount the regulator directly on the housing of the alternator, or within the alternator housing itself. It is additionally possible to so attach the regulator that it is combined with the brush holder for the slip ring brushes connected to the excited field.

Customary regulators usually were located in a comparatively large housing. With improvements in alternator design, it is possible to decrease the size of the alternators and the voltage regulator housings become larger and larger, with the respect to the alternators themselves.

Most customarily used voltage regulators of the semiconductor or solid-state type are divided into a control portion and a power, or power output stage portion. In such usually used structures, both the control portion as well as the power stage are constructed as a single unit, and suitably dimensioned to be matched to a specific type of alternator. Any adjustment or fine matching had to be done with respect to the entire voltage regulator. It was possible to test only the entire voltage regulator, as a whole, and matching of one voltage regulator designed for a specific alternator to the operation of a different alternator was not readily possible.

It is an object of the present invention to provide a voltage regulator which is of minimum size so that it can be readily attached to a generator housing, preferably by being mounted directly on the slip ring brush holder structure thereof, and which requires only a minimum amount of space, and which is additionally so arranged that it can be easily electrically connected within the alternator, requiring a minimum of connection components, or labor.

Subject matter of the present invention

Briefly, the voltage regulator includes, within a single housing, a freewheeling diode, a control circuit portion and a power circuit portion, the control circuit and power circuit portions being, preferably, physically separate within the housing so that matching of any one specific portion thereof to a specific type of alternator is readily possible, and changes in production to match a different type of alternator can be easily accomplished. The housing itself includes a preferably flat metallic base and a housing cap secured to the metallic bottom and sealed thereto, for example by welding, and preferably of the type used as a standard cap transistor housing. Two leads are sealed, in insulated relation, through the metallic base, and extend therefrom in the form of connecting pins, one lead being connected to be directly inserted in a suitable socket for one of the terminals of the alternator, the other one being adapted for connection to a suitable socket forming the positive output terminals of the alternator, the metallic base plate itself being connected to a brush, or brush holder of the alternator.

The structure permits associating the housing of the voltage regulator directly with the brush holder of the slip ring brushes of the alternator; this permits an extremely simple electrical connection to the field or excitation brush controlling the output voltage of the alternator.

By separating the power stage and the control stage, or portion, within the voltage regulator within the housing, it is possible to separately energize and test the respective stages. It is readily possible to change the operating parameter of the respective stages without changing in any way the manufacturing flow of the structure, when assembled in serial production; it is only necessary to exchange integrated or printed circuit elements on which the separate stages are mounted in order to vary the overall function of the voltage regulator.

The voltage level of the housing for the voltage regulator, in accordance with a feature of the invention, is preferably so selected that the power transistor as well as the free-wheeling diode need not be insulated within the housing, but permit direct attachment to the base of the housing, for example by soldering. The housing, formed similar to a power transistor housing, preferably is formed with a flat edge at either side thereof; this permits holding the housing in attachment jigs during manufacture and assembly of the housing to the alternator, so that it can be easily and precisely positioned in the alternator structure, while simultaneously providing for electrical connection thereto.

The concept of the voltage regulator is a modular one; it is thus possible to readily match its functional parameters to various types of generators without in any way changing the overall serial manufacturing steps. Any variations from a standard structure can be readily accommodated, requiring only minor additional steps or modification. For example, it is possible to associate a temperature sensor with the voltage regulator, for example to match the regulating effect to the temperature of the battery of the vehicle which is supplied with power from the generator.

The invention will be described by way of example with reference to the accompanying drawings:

FIG. 1b is a circuit diagram of the control stage of the regulator of FIG. 1a;

FIG. 4a is a horizontal sectional view, looked at from the tope, of a voltage regulator structure;

FIG. 4b is a vertical sectional view along line IVb—IVb of FIG. 4a, in which it is to be noted that the section line is not straight, but broken off to pass through the terminal posts;

FIG. 4c is a fragmentary sectional view taken along line IVc—IVc of FIG. 4a;

FIG. 5b is a sectional view along line Vb—Vb of FIG. 5a;

FIG. 6a is a top sectional view along line VIa—VIa of FIG. 6b;

FIG. 6b is a fragmentary sectional view along line VIb—VIb of FIG. 6a;

FIG. 6c is a fragmentary sectional view along line VIc—VIc of FIG. 6a; and

FIG. 6d is a side view taken along arrow VId of the structure of FIG. 6a.

Figure 1A:
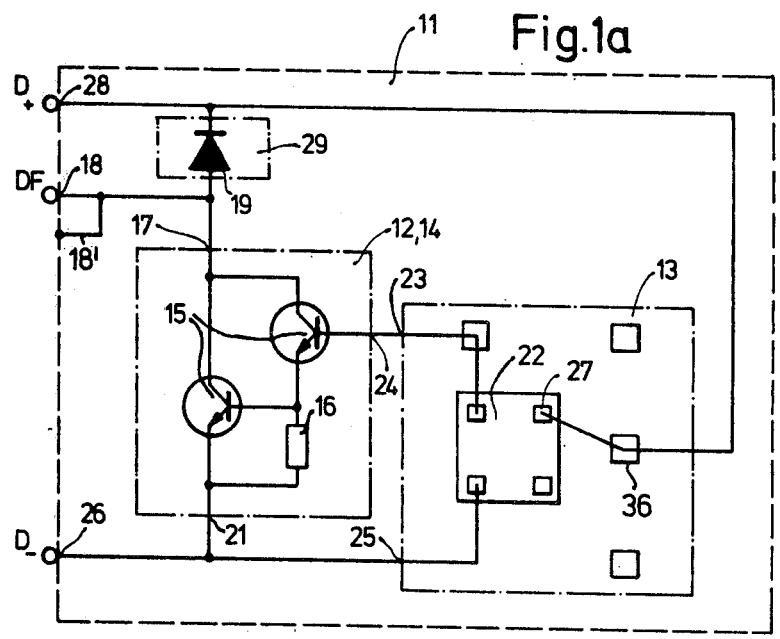
FIG. 1a shows a circuit and schematic wiring diagram of a voltage regulator in accordance with the present invention.

The circuit of the voltage regulator, basically, includes a power portion or power stage 12 (FIG. 1a) and a control portion or control stage 13. Power stage 12 is formed as an integrated circuit on a chip 14 and includes a Darlington-transistor combination 15 and a base-emitter resistor 16. The collector terminal 17 of the transistor combination 15 is connectable to a terminal 18, being the DF terminal of the regulator, for connection to the exciter field of the alternator. The collector terminal 17 is additionally connected to the anode of a free-wheeling diode 19, the cathode of which is connected to the positive terminal 28, forming the +D terminal of the voltage regulator. The emitter terminal 21 of the power transistor combination 15 is connected to a ground or chassis terminal 26, forming the —D terminal of the voltage regulator.

The control stage or control portion 13 is formed as an integrated circuit on a second chip 22. The output 23 of the control portion is connected to the input 24 of the power portion 12. The control stage 13 is connected to a ground or chassis bus 25, further connected to the terminal 26. The control connection 27 of the chip 13 is connected to the input or +D terminal 28 of the voltage regulator. The free-wheeling diode 19 is preferably formed as an integrated circuit on a third chip 29; it can also be combined with a support plate of ceramic supporting the chip 22 of the control stage 13.

Figure 1B:
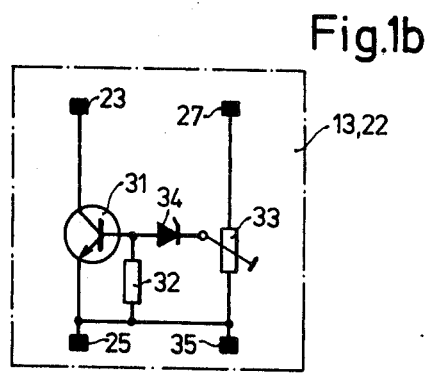

The control circuit integrated on chip 22 has a control transistor 31 (FIG. 1b). The switching path, that is, the emitter-collector path, is connected to output posts or terminals 25, 23, respectively. The base-emitter is bridged by a resistor 32. A voltage dividing resistor 33 is connected between the emitter and input terminal 27. The slider or tap of the voltage dividing resistor 33 is connected through a Zener diode 34 to the base of the transistor 31. The ground or chassis connection is preferably formed with two terminals 25 and 35. This voltage regulator preferably forms a standard circuit for operation with the battery of a vehicle, typically an automotive vehicle.

Figure 2:
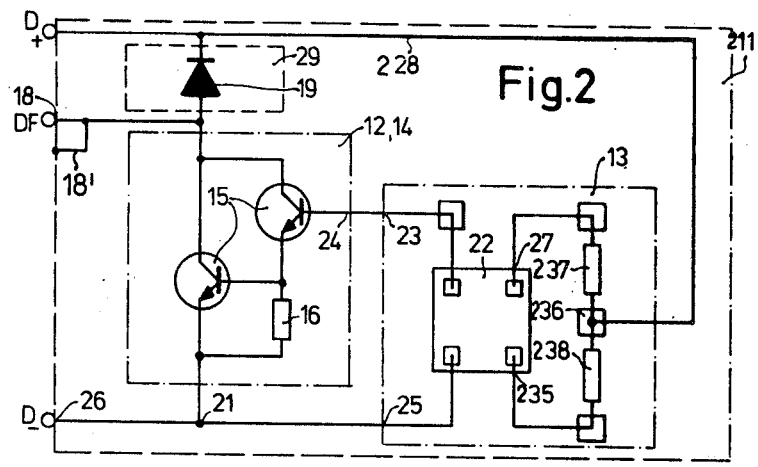
FIG. 2 is a schematic circuit and wiring diagram of a modification, specifically arranged for operation without a floating battery, or for multi-voltage operation, one voltage level, for example, including a battery.

FIG. 2: A standard voltage regulator of FIG. 1 is modified for operation without battery. If no battery is used with the output voltage from the generator, it is possible that the output voltage of the generator rises to high values which reach such levels that the elements or the components of the regulator 11 can be damaged or destroyed. It is usual therefore to include voltage-limiting circuits in the regulator itself. These voltage limiting circuits are connected in front of the input to the control stage, that is, terminals 27, 35 (FIG. 1). Elements disclosed in this figure, as well as in subsequent figures, which function similarly and are identical to those previously disclosed have been given the same reference numerals; elements which correspond in general operation to those previously described have been given similar reference numerals, incremented by a digit in the 100 position corresponding to the number of the figure.

The +D terminal is connected through a line 228 to a junction 236. Junction 236 is connected to two input resistors 237, 238 which, in turn, are connected to the terminals posts 27 and 235 on the chip 22. It is to be seen that only the connections on the control stage 13, for example formed as a printed circuit on ceramic plate, or integrated directly on chip 22 need be changed, the remainder of the voltage regulator 211 remaining the same. If the voltage regulator is to be used with a battery, but of higher battery voltage than that for which the standard regulator of FIG. 1a was designed, then the circuit of FIG. 2 can be used, with suitable dimensioning of the input resistors 237, 238 respectively.

Figure 3A:
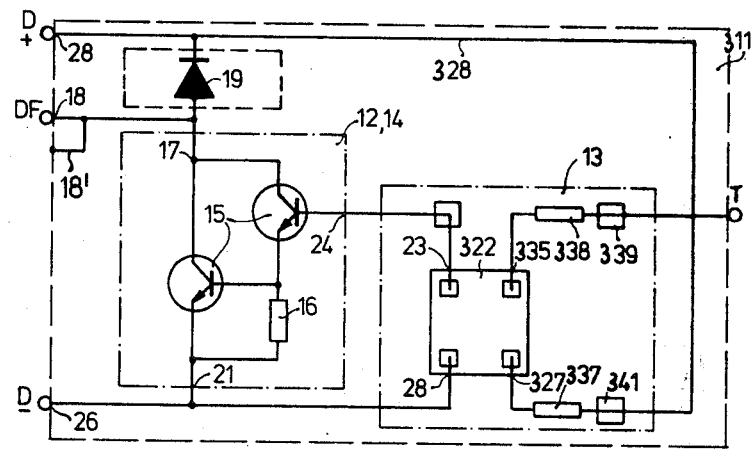
FIG. 3a illustrates a modification adapted for association with a temperature sensor.
Figure 3B:
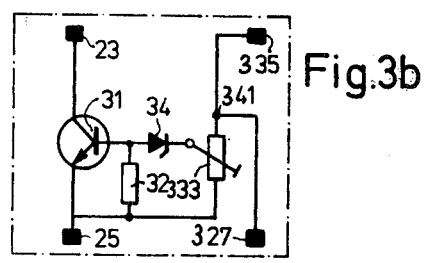
FIG. 3b is a schematic circuit diagram of the control stage for use with a temperature sensor.

Embodiment of FIG. 3: The voltage regulator 311 can be used with an additional sensing input, for example sensing an additional voltage or temperature, or both. Terminal 335 of the chip 322 is used for connection of the chip 322 to the additional voltage and/or temperature sensor. A second input resistor 338 is provided connected between terminal 335 and a terminal 339 on ceramic plate 313 supporting chip 22. The terminal 327 of chip 322 is used, as before, to connect to the positive terminal +D through input resistor 337, connected between chip 322 and terminal 341 of the regulator 311. The resistor 337 is not strictly necessary and be replaced by a conductive bridge if the dimensioning and voltage relationships of the regulator, with respect to the output voltage of the generator, so require.

The terminal 18 is connected to ground or chassis of the regulator as schematically indicated by line 18' (FIGS. 1–3). Only two additional output pins, carried in insulated relationship through the chassis, are thus necessary for the positive and negative battery connections +D and —D, that is, terminals 28, 26.

Figure 4C:
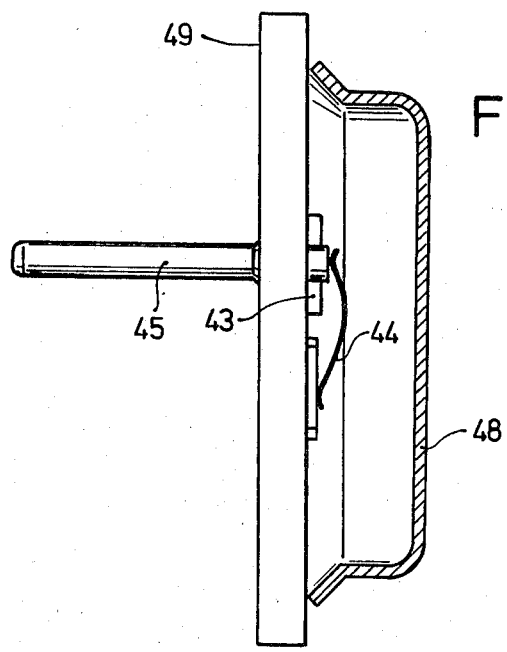
Figure 4D:
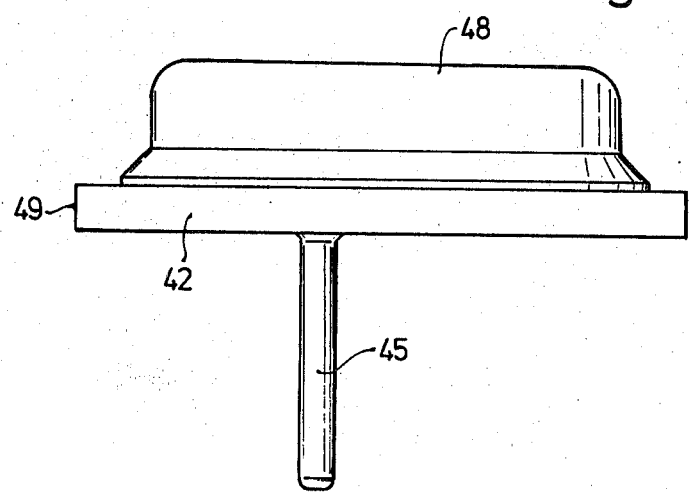
FIG. 4d is a side view of the structure of FIG. 4a in the direction of the arrow IVd.

FIG. 4 illustrates a concrete mechanical construction of an embodiment of the invention in standard construction, in which the electrical circuit corresponds to that discussed in connection with FIGS. 1a and 1b. The overall, standard construction lends itself readily to variations to match the particular voltage regulator to specific alternators or on-board network requirements of the vehicle with which the voltage regulator alternator is to be used.

A housing base plate 42 is made of a material which is good electrically as well as heat conductive. Chip 14 forming the power stage 12 and a third chip 29 on which a free-wheeling diode 19 is formed are soldered to the base 42. A ceramic plate 43 is secured to the base 42 of the housing, forming an insulator. The second chip 22 is secured to ceramic plate 43. Jumper wires, collectively shown at 44, interconnect the respective chips 14, 22, 29. The jumpers 44 also connect to two connecting pins 45, 46, for the +D and −D terminals, respectively. Rather than using soldered jumper wires, it is possible to use spring clips which are soldered to the connecting pins and to the chip contact connections, respectively. The pins 45, 46 are insulated with respect to the base 42 of the housing by an insulator 47 and sealed therethrough. The voltage regulator is closed by a cover 48 which, preferably, is welded to the base 42. The base 42 is formed in generally diamond-shaped form, with rounded corners and attachment holes, the lateral points of the diamond being removed to provide for two parallel lateral edge surfaces 49 to facilitate positioning of the entire completed regulator assembly in a mounting or attachment jig during assembly of the voltage regulator.

Figure 5A:
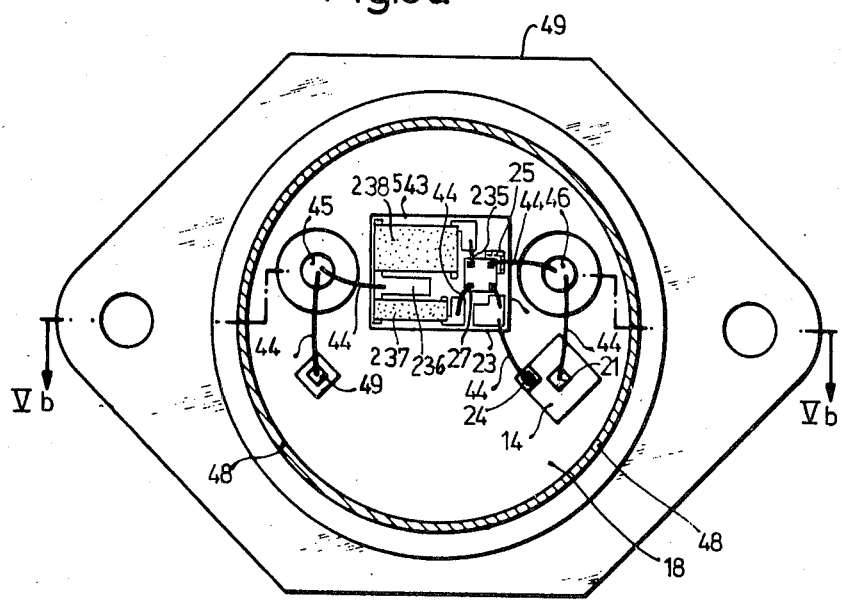
FIG. 5a is a top sectional view along line Va—Va of FIG. 5b.
Figure 5B:
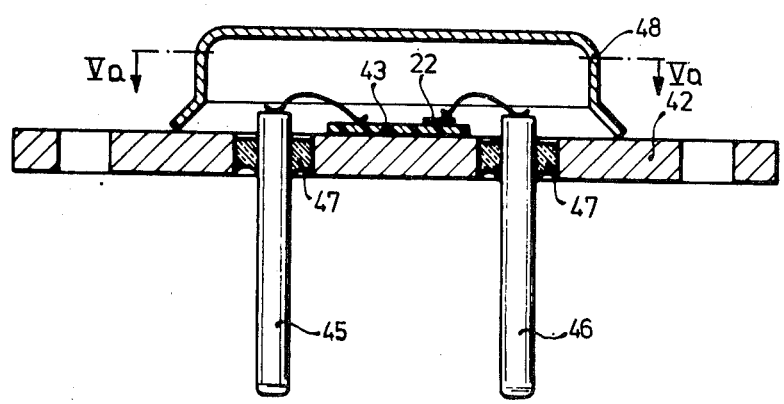

FIGS. 5a, 5b: The structure within the housing 548 is that used for the voltage regulator the circuit of which is shown in FIG. 2. The input resistors 237, 238 are located on the ceramic plate 543. In all other respects, the voltage regulator is similar to that described in connection with FIG. 4.

Figure 6C:
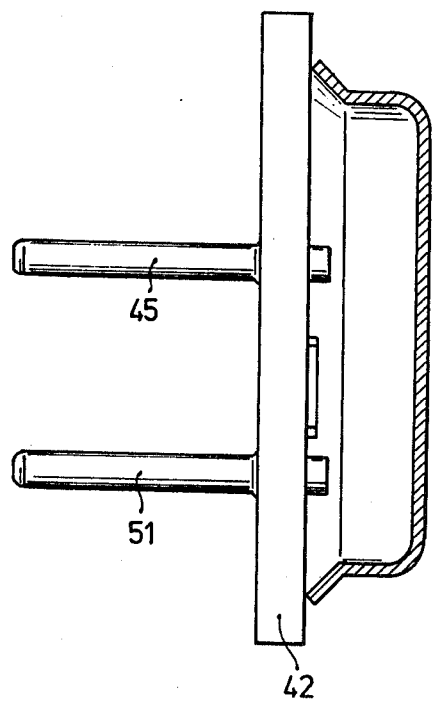
Figure 6D:
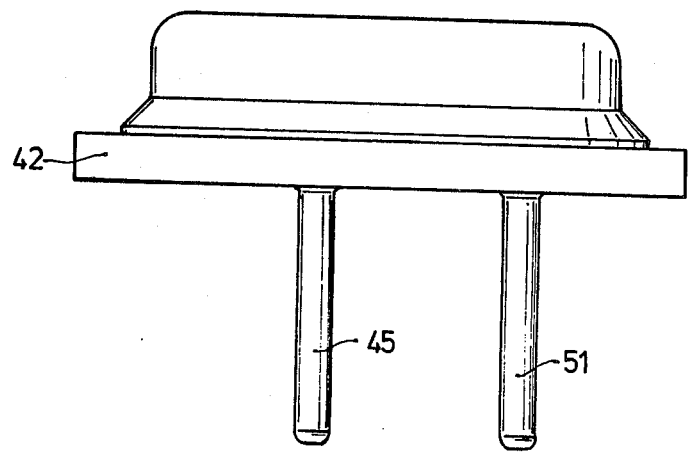

FIG. 6: A third connecting pin 51 (FIG. 6a, FIG. 6b) is provided which is located in insulated relation with respect to the conductive base plate 642. This embodiment is used for the circuit in accordance with FIGS. 3a, 3b. The additional pin 51 is internally connected to terminal 339 on the ceramic plate 643. Plate 643 is not shown in FIG. 6a to permit a better illustration of the showing of the pins 45, 46, 51. The additional pin 51 is connected to the terminal T (FIG. 3a) and forming the additional sensing input terminal, for example to provide a temperature input signal.

Various changes and modifications may be made within the scope of the inventive concept.

The base plate 42, 642 of the housing can be formed with an additional connecting pin or lug metallically and electrically secured thereto so that the voltage regulator can be connected to the brush holder assembly by a mere plug-in connection of, for example, lug or pin 46 to the negative slip ring brush and the additional lug or pin, secured for example by welding to the base plate 42, to the positive slip ring brush. The only additional free connection then will be to lug or pin 45 to connect the positive output voltage of the generator, and its rectifier assembly to the voltage regulator to control the duty cycle of excitation of the field of the alternator.

Figure 7:
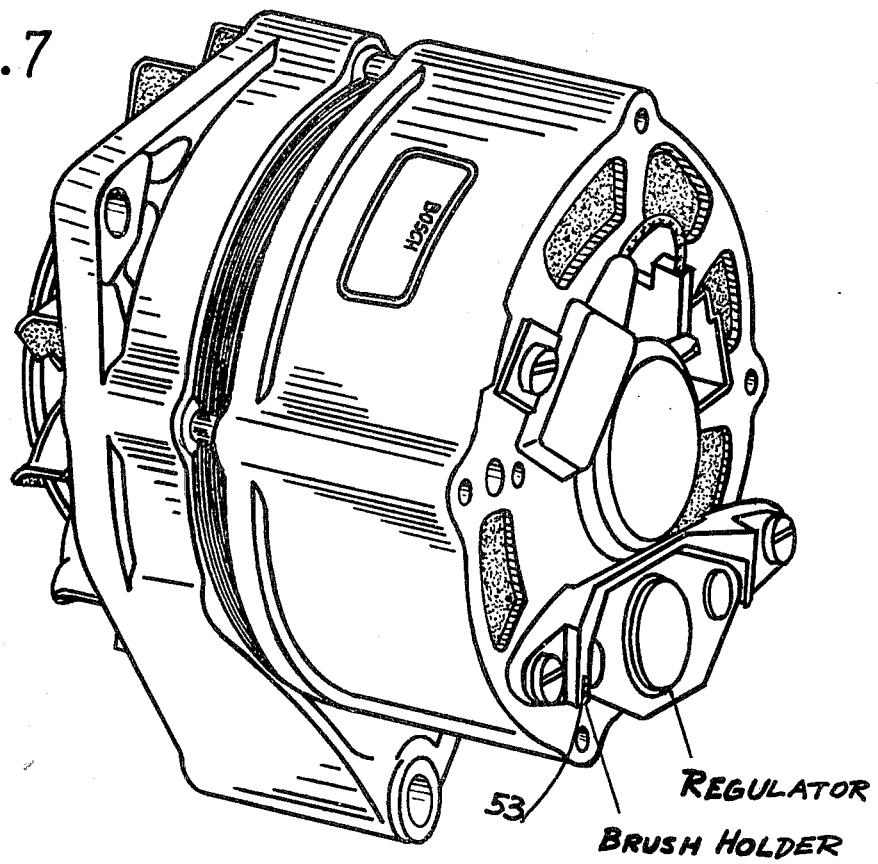
FIG. 7 is an prespective view of the alternator with the brush holder and the solid state regulator mounted thereon.

The voltage regulator structure is particularly adapted for association with the brush holder of an alternator slip ring brush, forming the positive output terminal thereof. FIG. 7 shows, schematically, a slip ring brush holder structure 53 of an alternator. As can be seen, the base plate 42, 642, respectively, is directly secured to the brush holder which is insulated from the housing of the alternator as such. This permits soldering the chip 14 of the power stage 12, as well as the chip 29 of the free-wheeling diode 19 directly to the base plate 42, and the brush holder structure provides for additional heat dissipation from the active semiconductor units within the voltage regulator. The two terminal pins forming the positive and negative input terminals are readily connectable with respective pigtails in the alternator, or directly with respect to bushings or sockets formed in the alternator, or the rectifier assembly thereof. The connecting lug or pin 46, and forming the −D input to the regulator, especially, can be so located on the regulator structure that a suitable opening in the housing of the brush holder on the alternator can be engaged by the pin 46 to make a ground or chassis connection of the regulator with the negative terminal or ground or chassis connection of the alternator, and its rectifier, and of the vehicle itself. The regulator base and housing, therefore, are not connected at ground or chassis potential of the vehicle, and of the alternator, but rather to the positive terminal of the exciter brush holder, and hence to the exciter brush holder, and hence to the exciter brush. This arrangement facilitates assembly, testing, replacement and original construction.

We claim:

1. Voltage regulator for combination with an automotive-type generator, said generating having two line output terminals and an exciter field terminal, the voltage regulator comprising
   a free-wheeling diode (19);
   a control circuit stage (13);
   a power circuit stage (14);
   said circuit stages including active semiconductor elements (15, 31) and passive electrical circuit elements (16, 32, 33, 34);
   a housing (42, 48) having a metallic base (42) and a housing cap (48) secured to and sealed to the metallic base, covering and sealing said free-wheeling diode, and said circuit stages in one covered, sealed, composite element;
   an insulating plate (43) secured within the housing;
   two connecting lugs or pins (45, 46) passing through the housing and being sealed therethrough in insulated relation with respect thereto, and forming the positive and negative line terminals of the voltage regulator, connectable to the line terminals of the generator, the housing forming the field terminal of the voltage regulator and being connectable to the exciter field terminal of the generator, said housing, base and cover forming a standard power transistor housing package assembly;
   wherein the power circuit stage (12) comprises a first chip (14) forming an integrated circuit directly electrically and mechanically secured to the metallic base (42) of the housing of the regulator;
   the control circuit portion (13) comprises a second semiconductor chip (22) forming an integrated circuit supported on the insulating plate (43);
   and wherein the free-wheeling diode comprises a third semiconductor chip (29) on which the diode structure is grown, the third chip (29) being secured to the metallic base (42) of the housing of the regulator.

2. Regulator according to claim 1, wherein the generator includes a slip ring brush holder (53),
   said slip ring brush holder being formed with a seating surface engageable with the base (42) of the housing, and connection means electrically connected to the chassis or housing structure of the generator and connectable with one of the line terminal lugs or pins of the voltage regulator.

3. Regulator according to claim 2, wherein the connection of said slip ring brush holder and said voltage regulator housing is a pin-and-plug connection.

4. Regulator according to claim 1, wherein the metallic base (42) and the housing cap (48) of the housing are welded together.

5. Regulator according to claim 1, wherein the metallic base (42) of the housing of the regulator is formed with flat, mutually parallel, lateral surfaces (49) to facilitate holding and orienting the housing in a holding fixture or jig.

6. Regulator according to claim 1, wherein the free-wheeling diode (19) is directly electrically and mechanically secured to the metallic base (42) of the housing of the regulator.

7. Regulator according to claim 1, wherein the power stage comprises a Darlington transistor combination having an output transistor component (25), a driver transistor component (26) and a resistor component (27), all said components being integrated on a single chip (LT) forming said power stage and located in said housing.

8. Regulator according to claim 1, wherein the insulating plate (43) comprises a ceramic plate secured to the base (42) of the housing.

9. Regulator according to claim 7, wherein the collector of the power transistor component is electrically and thermally connected to the metallic base plate (42) of the housing.

10. Regulator according to claim 1, further comprising at least one input resistor (37, 38) within the housing of the regulator and connected between a terminal thereof and the control circuit stage.

11. Regulator according to claim 10, wherein two input resistors (37, 38) are provided, both input resistors being located within the housing (42, 48) of the regulator.

12. Regulator according to claim 10, wherein at least one of the input resistors (37, 38) is secured to the insulated plate (43).

13. Regulator according to claim 12, wherein the insulated plate (43) comprises a ceramic plate carrying contact terminals (43) and means (44) connecting the contact terminals to the connection pins or lugs (45, 46);

and wherein two input resistors (37, 38) are provided, connected as a voltage divider and to the control circuit stage (13), the tap point of the voltage divider being connected to the terminal (236) on the ceramic plate (543) which is connected to the lug or pin (45) forming the positive terminal (28) of the regulator.

14. Regulator according to claim 12, wherein (FIGS. 3, 6) the insulated plate (643) comprises a ceramic plate secured to the base (642) of the housing;

a sensing input pin or lug (51) being secured to the housing and extending therefrom, and sealed therethrough in insulated relation;

and wherein one of said input resistors (338) is connected between the semiconductor chip (322) and the connecting terminal (339) formed on the ceramic plate (643), the connecting terminal on the ceramic plate being connected to the further, or additional connecting lug or pin (51).

15. Regulator according to claim 14, further including engine operating sensing means (T) providing a further or additional sensing output signal, said sensing means being connected to said further or additional lug or pin (51).

16. Regulator according to claim 12, wherein one of said input resistors has effective resistance of zero and forms a connecting bridge, said connecting bridge being connected between one input (327) of the control circuit stage and a terminal (341) formed on the insulating plate, said terminal being connected to the positive line terminal of the regulator (311);

and wherein an input resistor (38) of finite resistance is connected between a further terminal (335) of the semiconductor chip forming the control circuit stage and an additional terminal (339) formed on the insulating plate.

17. Regulator according to claim 1, wherein the power stage comprises a power transistor, the collector (17) of the power transistor of the power stage being electrically and thermally connected to the metallic base (42) of the housing.

18. Regulator according to claim 1, wherein the free-wheeling diode (19) is secured to said insulating plate.

19. Regulator according to claim 1, further comprising an additional or further connecting pin or lug (51), said additional or further connecting pin or lug connectable to receive a sensing signal representative of the voltage value, said further or additional connecting pin or lug being connected to the control stage (13) of the regulator.

* * * * *